United States Patent [19]
Notohardjono et al.

[11] Patent Number: 5,744,975
[45] Date of Patent: Apr. 28, 1998

[54] ENHANCED DEFECT ELIMINATION PROCESS FOR ELECTRONIC ASSEMBLIES VIA APPLICATION OF SEQUENTIALLY COMBINED MULTIPLE STRESS PROCESSES

[75] Inventors: Budy Darmono Notohardjono, Poughkeepsie; Vincent Cozzolino, New Paltz, both of N.Y.

[73] Assignee: International Business Machines Corporation, Armonk, N.Y.

[21] Appl. No.: 660,621

[22] Filed: Jun. 6, 1996

[51] Int. Cl.$^6$ .................................................. G01R 31/02
[52] U.S. Cl. .................................................. 324/760
[58] Field of Search .............................. 324/760, 765, 324/158.1; 73/571

[56] References Cited

U.S. PATENT DOCUMENTS

| | | | |
|---|---|---|---|
| 3,664,181 | 5/1972 | Conrad et al. | 73/571 |
| 4,912,980 | 4/1990 | Baughn | 73/663 |
| 5,030,905 | 7/1991 | Figal | 324/158.1 |
| 5,187,432 | 2/1993 | Bauernfeind et al. | 324/158.1 |
| 5,226,326 | 7/1993 | Polen et al. | 73/571 |
| 5,278,495 | 1/1994 | Beaton et al. | 324/158.1 |
| 5,471,877 | 12/1995 | Brown | 73/571 |
| 5,513,538 | 5/1996 | Baker et al. | 73/865.6 |
| 5,516,028 | 5/1996 | Rasp et al. | 228/104 |

OTHER PUBLICATIONS

Hobbs, G.K., "Highly Accelerated Life Tests—HALT", Hobbs Engineering Corporation, Westminster, CO, 1990. (Month Unavailable).

Hobbs, G.K., "Highly Accelerated Stress-Screens—HASS", Hobbs Engineering Corporation, Westminster, CO, Apr. 14, 1990.

*Primary Examiner*—Ernest F. Karlsen
*Assistant Examiner*—Anh Phung
*Attorney, Agent, or Firm*—Marc A. Ehrlich

[57] ABSTRACT

A method for testing electronic assemblies having an electronic component affixed via solder or other such connections to a printed circuit board. The method includes combining, in order, three sequential stress test steps, into a single stress test for screening defects in the electronic assemblies. In particular, the test combines a thermal cycling stress test followed by a electrical burn-in stress test coupled with functional monitoring of the assembly, followed by a random vibration stress test coupled with functional monitoring of the assembly, each test is imposed with defined parameters upon the electronic assembly. The combination, order, and parameters of the sequential stress test steps provide a single test for electrical assemblies which substantially screens all such assemblies having systematic or random defects while imparting minimal reduction in useful life to the defect-free assemblies by virtue of the testing, thereby resulting in a high reliability product.

28 Claims, 8 Drawing Sheets

ENHANCED DEFECT ELIMINATION PROCESS FOR ELECTRONIC ASSEMBLIES VIA APPLICATION OF SEQUENTIALLY COMBINED MULTIPLE STRESS PROCESSES

FIELD OF THE INVENTION

The present invention relates to a method for testing electronic assemblies including electronic components connected to printed circuit boards, and more particularly, to a method for testing for electrical and physical defects occurring within electronic components, printed circuit boards or the connections therebetween by causing marginal assemblies to fail while not damaging defect-free assemblies.

BACKGROUND OF THE INVENTION

Electronic assemblies which include surface-mount and/or plated-through-hole type electronic components affixed via a solder connection or other mechanical means of connection such as a screw or adhesive, to a printed circuit board, are constantly subjected to various stresses, including but not limited to, changes in temperature, changes in electrical state, and shock or vibration. For example, regarding solder connections present in electronic components on these assemblies, these stresses can be due to differences in coefficients of thermal expansion caused by dissimilar materials. In addition, different electrical loads and vibrations which may be imposed upon these electronic assemblies also stress solder connections. These stresses may cause the solder connection points to flex or move and thus, break apart, or weaken affecting their useful life and joint reliability. Clearly, if the solder connection breaks the assembly fails; an unwelcome result. Moreover, these same thermal, electrical and vibrational stresses may precipitate defects in the electronic components and in the printed circuit board, which comprise the electronic assembly. For example, the variation of an electrical load may result in the precipitation of latent defects within the electronic component, likewise, vibration stress may cause cracking within the printed circuit board. As a consequence of the occurrence of any of these defects, the electronic assembly is likely to fail.

In order to remain competitive, it is incumbent upon a manufacturer to ensure the production of reliable electronic assemblies. It therefore follows that a means must be devised to decrease the occurrence of stress induced failures in electronic assemblies which are shipped to customers. Accordingly, there exists a need in the computer industry to test electronic assemblies sufficiently to detect and screen marginal products from a production volume of such assemblies.

A critical issue confronted by electronic assembly manufacturers is how to test for systematic and random defects while not damaging the product being tested. In particular, some of the questions that need to be addressed by these manufacturers include: What tests should be performed on the electronic assemblies, what sequence should the tests follow, and what degree of stress should the assemblies be subjected to in order to avoid damaging the assemblies while ensuring that the test and the concomitant screening process is complete? The present inventive technique was conceived in light of the need for the development of an optimal test which addresses each of these questions.

Historically, while most stress tests have utilized various temperature, electrical power on/off, and vibration patterns, to date, an optimal test was not obtained: first, the combination of all of these tests into one functional test was not utilized; second, the correct order to apply the different stresses to the product was not clear; and third, the exact parameters (i.e. temperatures, times, frequencies, etc.) to be applied during each of these tests were not clear. Prior electronic assembly testing methods failed to address these important criterion leaving the manufacturer to devise such screening tests on an ad-hoc basis, and resulting in the shipment of an unacceptably high percentage of marginal assemblies.

For example, a set of papers published by Dr. Gregg K. Hobbs entitled "Highly Accelerated Life Test—HALT™" and "Highly Accelerated Stress Screens—HASS™", Proceeding Institute of Environmental Sciences, 38th Annual Technical Meeting, Nashville, Tenn., May 3–8, 1992, p. 377–387, p. 451–457" discuss the qualification and screening of electrical assemblies ("HALT" and "HASS" are both trademarks of Hobbs Engineering Corporation). The HALT™ process is described as a step-stress approach for qualification of a production product, in which successive levels of stress are applied to the production product to discern the destruct and operating limits thereof. The HASS™ process involves the screening of products using stresses that are substantially higher than those experienced in the normal use of the products, so as to produce a failure acceleration factor which is exponential in relation to the increased stress. The accelerated failure rate precipitates more failing production units in a shorter amount of time and consequently exposes good units, which are subsequently shipped to customers, to less stress. While the concept of accelerated testing achieves the objectives of shorter testing time and less damage to defect-free production volumes, neither publication espouses with any particularity, an ordered test process which combines temperature, burn-in, and vibration tests into a single stress test. Moreover, the publications fail to specify test parameters to be applied during the stress tests for precipitating such failure mechanisms. Rather, the focus in these articles is conceptual, leaving it to the manufacturer to apply these principles in determining optimal test criterion for precipitating defects for a particular product.

Previously, a manufacturing screening process was put in place at IBM Corporation, by the IBM Mid Hudson Valley Reliability Group located in Poughkeepsie, N.Y. (IBM is a registered trademark of International Business Machines Corporation located in Armonk, N.Y. and is the assignee of the present application), for screening manufacturing defects in electronic assemblies such as the Switcher Assembly for the Scalable POWERparallel Systems (SP) family of scalable parallel processing systems currently manufactured by IBM ("SP" and "Scalable POWERparallel Systems" are trademarks of International Business Machines Corporation). In this process, temperature cycling, and random vibration stress tests were performed on the assemblies, however the particular optimal combination and ordering of stress tests and parameters for each of the tests incorporated by the present invention were never contemplated.

From the foregoing it is clear that there exists a need to develop an optimal test for screening defective electronic assemblies, which has heretofore not been adequately addressed in this field of manufacturing. The development of such an optimal test would provide a number of specific advantages to the manufacturer. In particular, in accordance with such a test, electronic assemblies may be tested to a degree which permits the manufacturer to screen all of the marginal products from a production volume thereof, and consequently distribute only high reliability products.

Moreover, customer satisfaction with the product that is shipped is improved, since the resultant assemblies are not damaged via the performance of this test, and consequently the useful life of the assemblies is minimally affected. Accordingly, the present inventive technique addresses the foregoing concerns by providing a preferred embodiment of the optimal test including the combination and order of test steps, and the corresponding parameter values which are needed to administer such an optimal test.

SUMMARY OF THE INVENTION

The foregoing problems and the shortcomings of the prior art are overcome and additional advantages are provided by the present invention, in which a sequential stress testing technique is implemented to screen defective electronic assemblies which include defects within their associated electronic components, printed circuit boards or the connections therebetween.

The present invention is generally directed at providing a test for detecting marginal/intermittent electronic components, printed circuit boards and the connections therebetween, in electronic assemblies. More particularly, the test subjects an electronic assembly to a sequence of thermal cycle test steps, electrical burn-in test steps, and random vibrations test steps in a specific order and with specific test parameters.

In an embodiment of the invention, the electronic assembly is first subjected to the thermal cycling test steps. Beginning at room temperature, the product is subjected an extreme low temperature and an extreme high temperature, and maintained at each of these temperature extremes for 30 minute intervals. These steps are repeated 5 times before the product is returned to room temperature.

Second, the electronic assembly is subjected to the electrical burn-in test step. The assembly is burdened with a certain percentage of its full electrical load as defined in the manufacturer's specification. Thereafter, the ambient temperature is raised from room temperature to a predetermined test temperature, at which, the assembly's power is alternately switched on and off for 15–30 minute intervals, while functionally exercising the assembly and monitoring the electrical signals thereof for anomalies from expected outputs, at least hourly, until the total power on/off cycle time is 2 hours. Thereafter, the assembly is powered on at the predetermined test temperature for 2 hours with the aforementioned electrical monitoring in place. This entire stress sequence is then repeated until the total electrical burn-in stress time is 11–22 hours.

Finally, the assembly is subjected to the random vibration test step. The product is powered-on and is randomly vibrated about at least two different axes: first the product is vibrated about the axis in which the assembly is to be mounted when in use, and then in an axis perpendicular to the mounting position and optionally about the remaining axis. These random vibration tests each last for 10 minutes at 10 Hz–60 Hz, 0.005–0.04 $g^2$/Hz; 70–1000 Hz, 0.005–0.01 $g^2$/Hz. In addition, the assembly is subjected to functional stress and outputs are monitored for electrical signal anomalies during the random vibration step.

Accordingly, via the present invention, a single, complete stress test addresses both systematic and random defect mechanisms which naturally occur during manufacture, shipping, installation, and use of an electronic assembly. Furthermore, the present invention provides a means for discovering faulty electronic assemblies while not damaging good products during the test process, thereby reducing the likelihood of product failure and ensuring that only quality products are delivered to the customer. In addition, the parameters of the test used in the present invention yield an extremely effective screening test at relatively low cost.

The foregoing and other objects, features and advantages of the invention will be apparent from the following more particular description of the preferred embodiment of the invention as illustrated in the drawings.

BRIEF DESCRIPTION OF THE DRAWINGS

The subject matter which is regarded as the invention is particularly pointed out and distinctly claimed at the conclusion of the specification. The foregoing and other features and advantages of the invention will be apparent from the following detailed description in conjunction with the accompanying drawings, in which:

DETAILED DESCRIPTION OF THE PREFERRED EMBODIMENT OF THE INVENTION

Before considering in detail the present inventive technique, it will first be instructive to briefly consider the manner in which electronic components are typically connected to a printed circuit board in electronic assemblies. In most modern electronic assemblies, leaded semiconductor components may be affixed to printed circuit boards via surface mount or plated through hole technologies.

Figure 1:
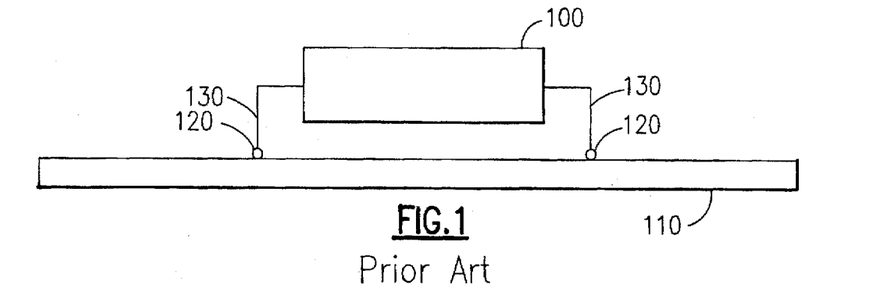
FIG. 1 illustrates an electronic component bonded to a printed circuit board by a solder connection in a surface mount configuration.

Referring to FIG. 1 an illustrative electronic component 100 which may, without loss of generality be a packaged semiconductor leaded chip, is shown bonded to a printed circuit board 110 via a surface mount technology technique. Via the surface mount bonding technique, a solder connection 120 is applied at the point of contact between the leads emanating from the component 130 and the surface of the printed circuit board 110. The solder joint 120 is thus formed between, and accordingly connects, the component leads and the surface of the printed circuit board 110.

Figure 2:
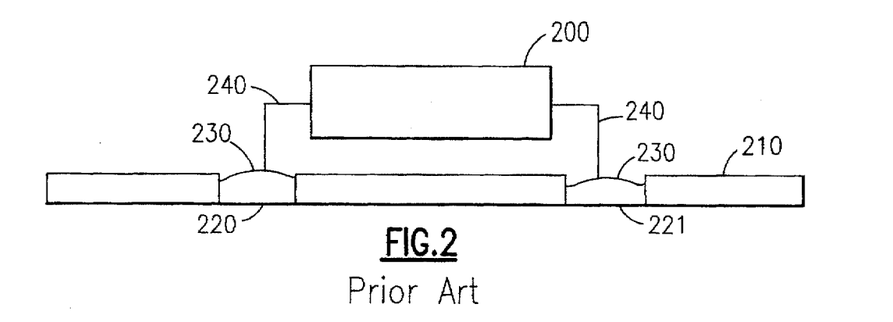
FIG. 2 illustrates an electronic component bonded to a printed circuit board by a solder connection in a plated through holes configuration.

Referring to FIG. 2 a similar illustrative electronic component 200 is shown bonded to a printed circuit board 210 via a plated through hole technique. Via the plated through hole bonding technique, the printed circuit board 210 includes a set of holes passing therethrough, illustratively, through holes 220 and 221. A solder connection 230 is applied at the point of contact between the leads emanating from the component 240 and the plated periphery of the through holes 220 and 221 thereby connecting the component 200 to the printed circuit board 210.

It will be understood that the interconnection scheme between electronic components and printed circuit boards in modern electronic assemblies is not limited to solder bonding technologies, but rather may include other interconnection schemes including, but not limited to, mechanical connection by means of screws and the like, or the use of adhesives, all of which will be readily known to those of skill in the art. An aspect of the present inventive technique is therefore directed at screening any type of defective connection existing on an electronic assembly via application of the subsequently described testing method.

Figure 3:
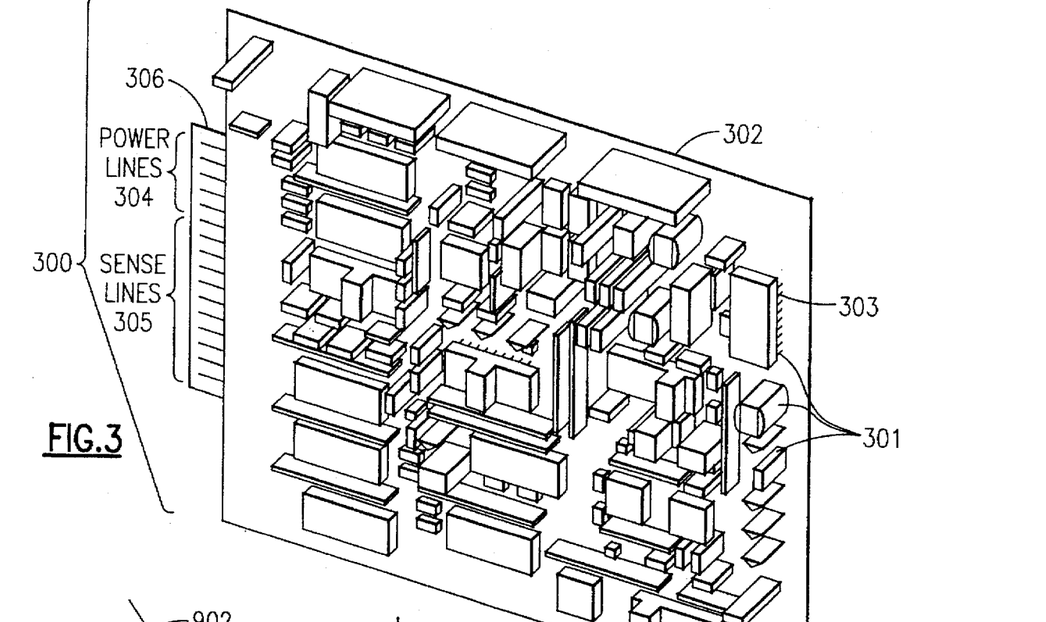
FIG. 3 illustrates an exemplary electronic assembly including at least one electronic component affixed to a printed circuit board via at least one connection point.

FIG. 3 depicts an exemplary electronic assembly 300, which as shown, includes a number of electronic components 301 mounted upon a printed circuit board 302, via connection points 303 (which in the illustrated embodiment are solder connection points). Manufacturing defects within a modern electronic assembly 300 may exist within any of the components 301, the solder or other connection points 303 or within the printed circuit board 302. In the illustrated example, a Power Supply Control Assembly for the System/390 family of computer systems ("System/390" is a registered trademark of International Business Machines Corporation) which is commercially available from IBM Corporation as part number 73F4256, is depicted as having a connector 306 from which it is possible to couple monitoring equipment to power lines 304 and sense lines 305 on the assembly. These lines are operative via the connector 306 to monitor signals indicative of the functional characteristics of the assembly while it is being tested as will be described below.

In light of the myriad manufacturing defects which may occur within the printed circuit board 302, the electronic components 301 or the connections 303 therebetween, during the manufacturer, shipping, installation and use of an electronic assembly 300, there exists a need to devise a technique whereby electronic assemblies 300 comprising these defect mechanisms are screened from inclusion in a production volume thereof intended for customers, while ensuring that the products which do not comprise the defects (i.e. defect-free products) are not harmed via application of the technique. Accordingly, the present inventive technique addresses these issues by providing a test for screening those electronic assemblies 300 which include defect mechanisms from a production volume of electronic assemblies, while imparting de-minimis reduction of useful life for the remainder of the assemblies by virtue of the screening process.

In accordance with the principles of the present invention, a method is disclosed herein in which an ordered combination of a series of defect screening test steps are combined into a single stress test for screening electronic assemblies 300. The test is performed using parameters which are chosen so as to ensure the complete screening of random and systematic defects from a population of electronic assemblies 300 without significantly diminishing the useful life of defect-free products during the test. The inventive screening technique is designed to detect manufacturing defects by precipitating failure mechanisms present within marginal ones of the electronic components 301, the printed circuit board 302 and the connection points 303 comprising the electronic assembly 300.

Figure 4:
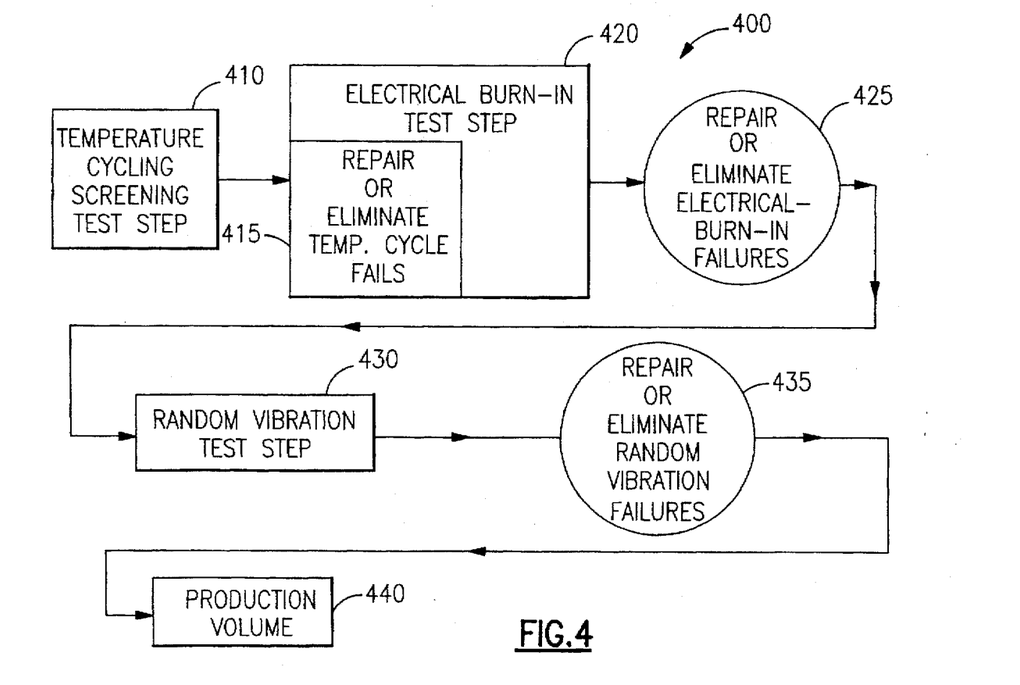
FIG. 4 depicts an overview of the present inventive sequential stress testing method.

Referring now to FIG. 4 a simple flow diagram 400 depicting an overview of the present inventive technique is shown. By reference to the flow diagram 400 it is clear that the present invention entails the combination of three defect screening test steps (i.e. 410, 420 and 430) into a single screening test for precipitating defects in electronic assemblies 300. At the first stage 410 in the screening process, the electronic assemblies 300 are subjected to a temperature cycling screening test step 410, the parameters of which will be subsequently addressed. The temperature cycling screening test step 410 includes the imposition of extreme temperature conditions upon the electronic assembly 300 and entails precise control of each temperature level imposed thereupon, as well as the time for which the temperature is to be so-imposed (the so-called dwell time) and the rate of temperature change from a given temperature level to another. The temperature cycling screening test step 410 is intended to precipitate defect mechanisms which would otherwise appear in the electronic assembly 300 in the field, due to temperature extremes which may be experienced thereby during use or transit. Without loss of generality, these defect mechanisms may arise from variations in thermal expansion coefficients within the connection points 303 as well as the lead lines protruding from the electronic component 301. Other defect mechanisms which may be precipitated via application of the temperature cycling test 410 include latent defects within the electronic components 301 and printed circuit board 302, such as oxide defects, aluminum step coverage defects, wire bond abnormalities, chip via defects, board level via defects, encapsulate delamination, and the existence of laminar discontinuities in the printed circuit board 302 as well as other such failure mechanisms, all of which are well known to those of ordinary skill in the art and accordingly need not be addressed in detail herein.

At stage 415 of the sequential stress test 400, which coincides with the initiation of the electrical burn-in test step 420, any electronic assembly 300 which fails the temperature screening test step 410 is either repaired or eliminated from a population of electronic assemblies 300 which are to be subsequently shipped to customers.

At the second test stage 420 of the flow diagram 400 the electronic assembly 300 is subjected to an electrical burn-in screening test step 420, details of which will be addressed below. This electrical burn-in screening test step 420 includes alternately powering up and powering down the electronic assembly 300, while functionally exercising the assembly and monitoring the signals therefrom for electrical anomalies such as signal discontinuities on the power 304 and sense lines 305, while also precisely controlling the test temperature level experienced thereby. Thereafter the powered-on electronic assembly 300 is maintained at the test temperature level for an extended period of time, after which the power on/off cycling begins again initiating a new electrical burn-in cycle for the electrical burn-in test. The electrical burn-in stress test step 420 is intended, without loss of generality, to precipitate failure mechanisms caused by defects in the electronic components 301 which would otherwise exhibit themselves during field use. These failure mechanisms within the electronic components 301 may include process defects introduced during semiconductor fabrication such as ionic contamination movement, oxide defects and other such defects that would be readily understood to those of ordinary skill in the art and accordingly need not be further described herein.

At stage 425 of the sequential stress test 400, any electronic assembly 300 which fails the electrical burn-in screening test step 420 as would be determined during the aforementioned functional monitoring of the assembly under test, is either repaired or eliminated from a population of electronic assemblies 300 which are to be subsequently shipped to customers.

Finally, at the third test stage 430 of the flow diagram 400 the electronic assembly 300 is subjected to a random vibration screening test step 430, which will be described in detail below. The random vibration screening test step 430 includes a 2 or 3 axis vibration of the assembly under test over a range of frequencies, and within a given range of power spectral density (PSD) (as measured in $g^2/Hz$), while concurrently functionally monitoring the tested assembly for electrical signal anomalies, such as signal discontinuities, in a manner similar to the monitoring for the electrical burn-in screening test step 420. The random vibration screening test step 430 is intended to precipitate, inter-alia, failure mechanisms caused by random vibrations which the units will typically experience during shipping or installation or in field usage, such as lead pull, connection point breakage, discontinuities created by printed circuit board flex and other such failure mechanisms which are well known to those of ordinary skill in the art.

At stage 435 of the sequential stress test 400, any electronic assembly which fails the random vibration screening test step as determined by the aforementioned functional monitoring of assemblies under vibrational stress, as well as via a visual inspection of the assemblies at the conclusion of the vibration stress 430, is either repaired, or eliminated from a production volume 440 of electronic assemblies which are to be subsequently shipped to customers.

Figure 5:
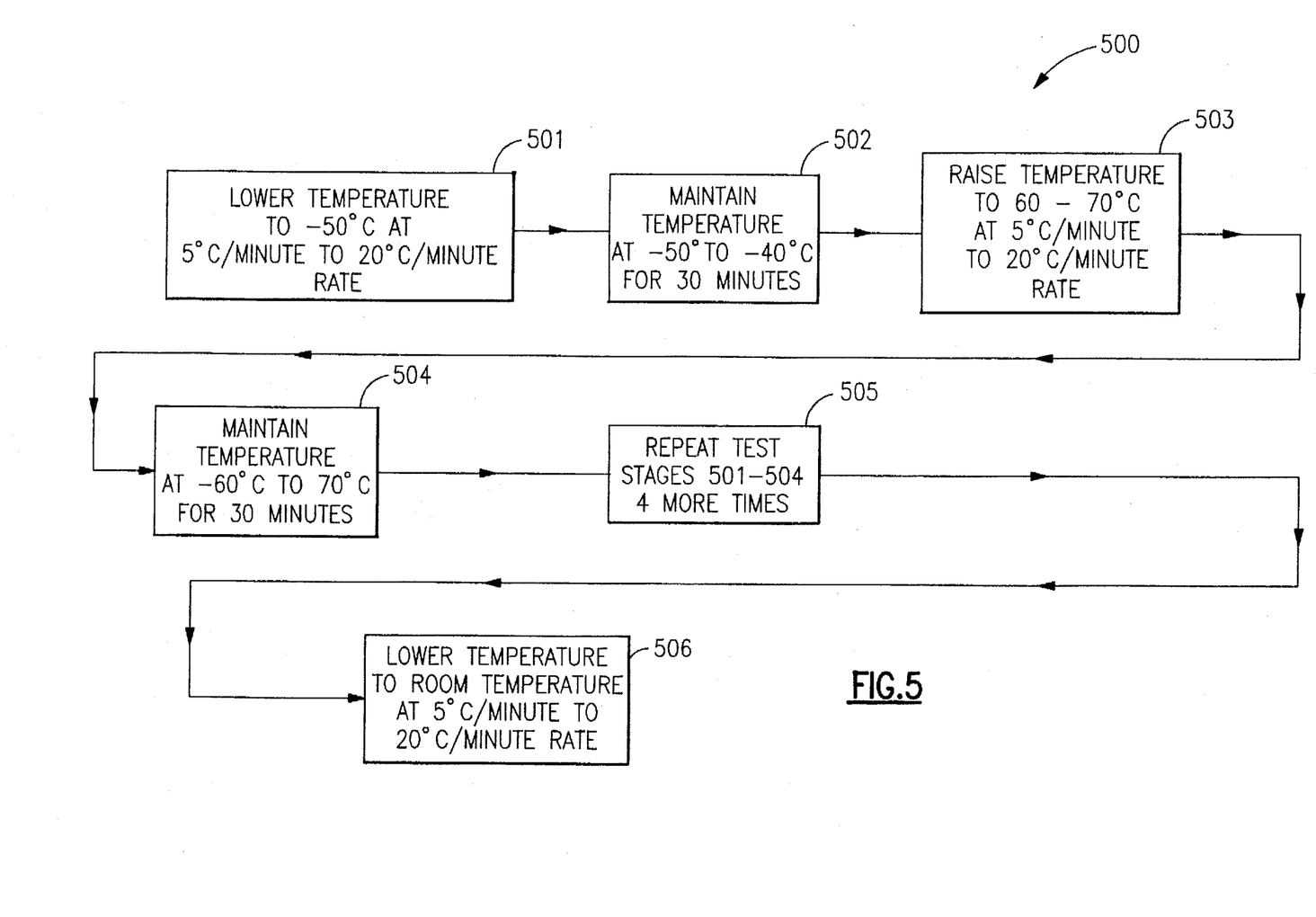
FIG. 5 illustrates a detailed flow diagram for the temperature cycling stress test step depicted as 410 in FIG. 4.

Turning now to a more detailed consideration of the aforementioned temperature cycling test step 410, reference may be had to FIG. 5, wherein a flow diagram 500 for the temperature cycling test step 410 is shown. Temperature cycling tests may be performed in any commercially available temperature cycling chamber, in particular, without loss of generality, our tests were performed with a Thermotron™, model F62-CHMV 25–25 thermal chamber, however any temperature cycling chamber which is capable of achieving the temperatures required in the present screening test and which is capable of providing a temperature rate of change as is herein specified will be acceptable.

At test stage 501, with the electronic assembly 300 powered-off, the temperature of the chamber is lowered from room temperature to minus 50° C. at a rate of between 5°–20° C./minute. Next, at test stage 502 the assembly is kept at a temperature range between minus 50° and minus 40° C. for 30 minutes, after which at stage 503, the temperature is raised to between 60°–70° C. at a rate of between 5°–20° C./minute. At test stage 504, the assembly being tested is maintained at a temperature of between 60°–70° C. for 30 minutes. Next, at test stage 505, previously described test stages 501 through stage 504 are repeated four more times, corresponding to a total of five temperature cycles, after which, at stage 506, the chamber temperature is lowered from the minus 50° C. through minus 40° C. temperature range to room temperature at a rate of between 5°–20° C./minute thereby completing the temperature cycling stress testing step 410. It will be apparent to those of ordinary skill in the art that the extreme temperatures for the previously described temperature cycle were chosen to simulate reasonable extreme temperatures which these assemblies may encounter during extreme field use, and accordingly that other temperature extremes may be so utilized. Furthermore, it will be readily apparent that variations in the quantity of devices that are situated within the temperature cycling chamber for simultaneous temperature cycling testing create a corresponding variation in the temperature extremes experienced by the assemblies, thereby producing non-uniform rates of defect precipitation therein. Thus, in our preferred embodiment, the number of assemblies tested in the temperature cycling stress test step 410 (as well as in the electrical burn-in stress test step 420) remains constant for each test of a subset of the production volume 440 of the electronic assemblies 300.

Figure 6:
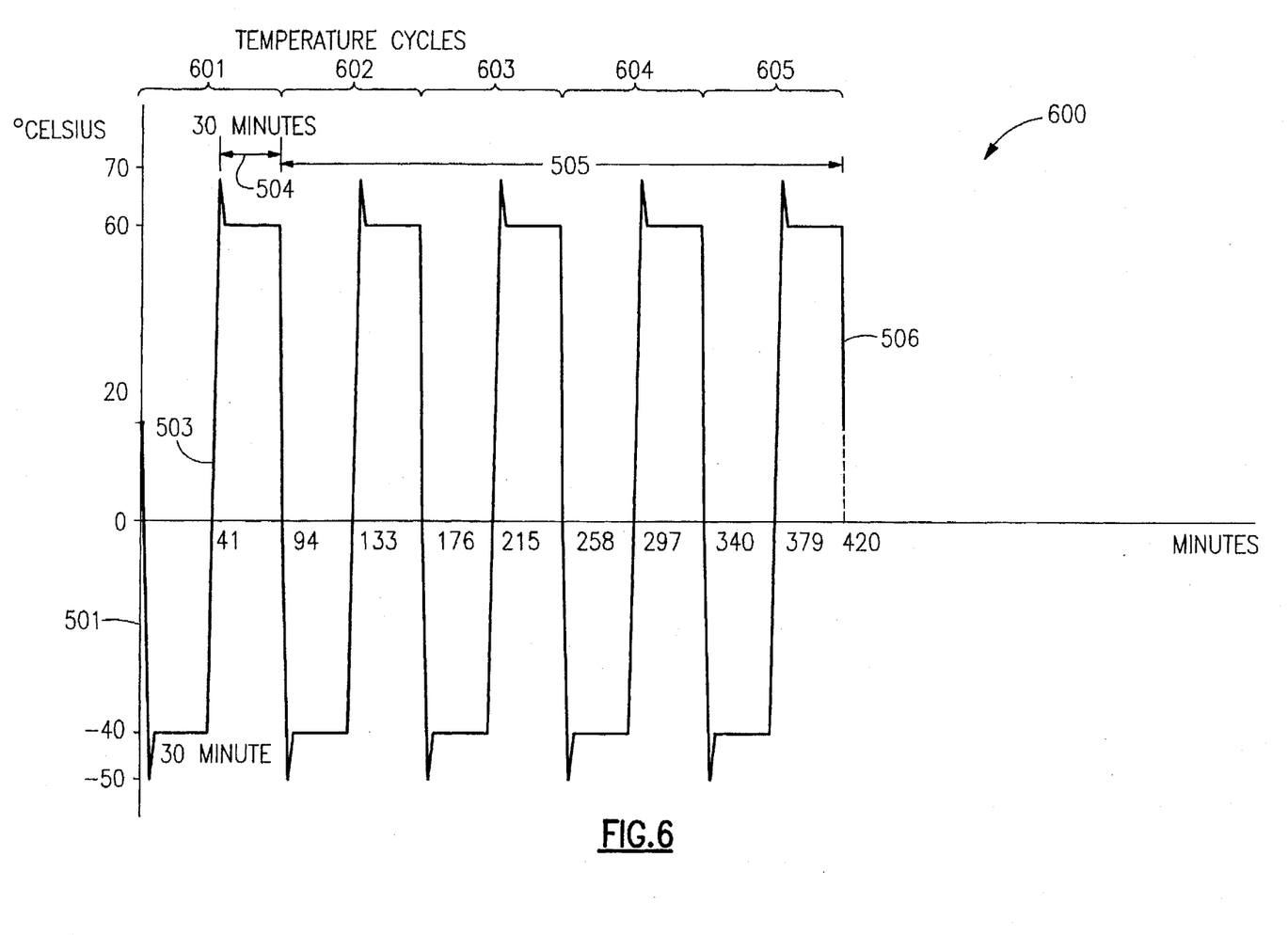
FIG. 6 illustrates a temperature profile in accordance with the temperature cycling stress test step 410.

A graphical illustration of the temperature profile 600 for the temperature cycling stress test step 410 is depicted in FIG. 6. The temperature of the electronic assembly 300 in the temperature cycling chamber, in degrees Celsius, is represented by the y-axis of the illustrated graph and the duration of the test steps, in minutes, is represented by the x-axis thereof. Via reference to the temperature profile 600, and in accordance with previously described test stage 505, it can be seen that the performance of the temperature cycling stress test step includes five cycles designated as corresponding cycles 601–605. Within each cycle, for example cycle 601, the temperature is first brought from room temperature, which for illustrative purposes has been chosen as 20° C., to minus 50° C. at a rate between 5°–20° C./minute, which for illustrative purposes has been chosen as 10° C./minute, corresponding to test stage 501 in FIG. 5. The temperature is then maintained at a temperature range between minus 50° C. through minus 40° C. for 30 minutes, corresponding to test stage 502. In accordance with test stage 503, the temperature is then elevated at a rate of between 5°–20° C./minute (illustratively 10° C./minute) to between 60°–70° C. and is maintained at a temperature of between 60°–70° C. for 30 minutes at test stage 504. Finally, the temperature cycle is completed by lowering the temperature from between 60° C.–70° C. back to room temperature at a rate of between 5°–20° C./minute (illustratively 10° C./minute) as per the step 501 (as repeated in step 505) which includes lowering the temperature to −50° C. at the 5°–20° C./minute rate.

In an embodiment of the invention in which thermal overshoot of the desired extreme temperatures may be tolerated, each of the desired temperatures at which the electronic assembly 300 is to be maintained within the temperatures cycles 601–605 are exceeded, after which the desired temperature for the electronic assembly 300 is subsequently achieved and maintained for the remainder of the corresponding portion of the test cycle. For example, by reference to FIG. 6, it can be seen that during the portion of the first temperature cycle 601 corresponding to stages 501–502 in the detailed flow diagram (in FIG. 5), the temperature is first lowered to minus 50° C. and then raised to minus 40° C. at which it is maintained for the remainder of the 30 minute period. Likewise, in the portion of cycle 601 corresponding to stage 503–504 in the detailed flow diagram, the temperature is first brought to 70° C. and then lowered to 60° C. where it is maintained for the remainder of the 30 minute period. Accordingly, the temperature profile illustrated in FIG. 6 will accommodate an acceptable amount of thermal overshoot, which is characteristic of many typically utilized temperature cycling chambers, while maintaining the electronic assembly 300 at the desired temperature level for the majority of the portion of the temperature cycle.

The electronic assemblies 300 that are to be screened from the production volume 440 in step 415 are determined upon the initiation of the subsequently described electrical burn-in stress test step 420. As a preliminary matter, in the electrical burn-in stress test step 420, the electronic assembly 300 is powered-on, and if the assembly is incapable of being powered-on it is deemed to have failed the temperature cycling stress test step 410. A failing assembly may either be repaired or eliminated from the production volume 440 of assemblies that are intended for subsequent shipment to customers. The electrical burn-in stress test step 420 may be performed in the same chamber and immediately following the temperature cycling stress test step 410.

Figure 7:
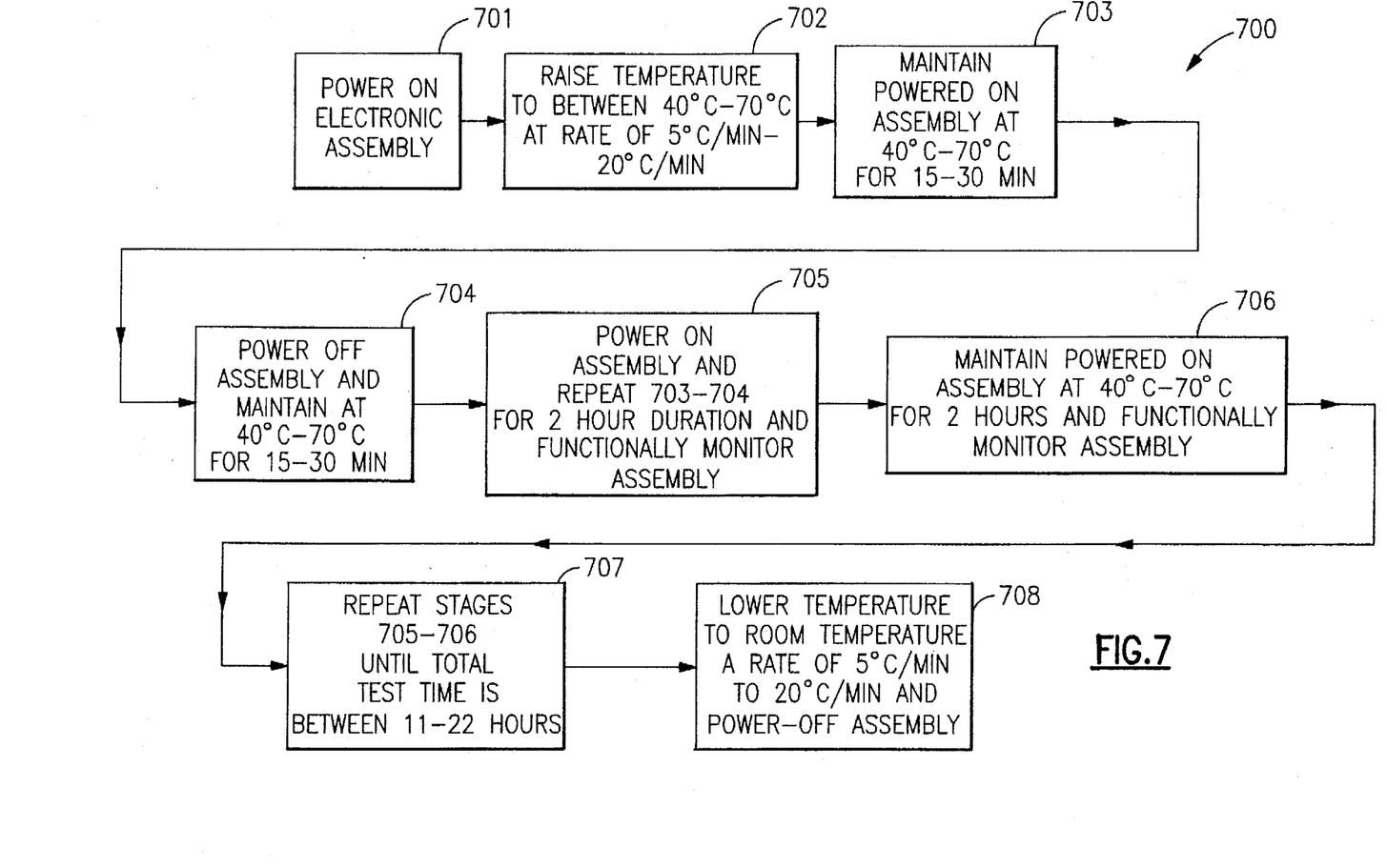
FIG. 7 illustrates a detailed flow diagram for the electrical burn-in stress test step depicted as 420 in FIG. 4.

FIG. 7, depicts a detailed flow diagram 700 for the electrical burn-in stress test step 420. At test stage 701, the electronic assembly 300 is powered-on to an electrical load that is between 50–100% of the manufacturer's specified operating load (i.e. the load which either the manufacturer's operating or test specification indicates for use of the product). Next, at stage 702, the temperature of the assembly being tested is raised at a rate of between 5°–20° C. to a maximum temperature of 40°–70° C., and thereafter, at stage 703, the powered-on assembly is maintained at the resultant 40°–70° C. temperature achieved in stage 702 for 15–30 minutes. In test stage 704, the assembly is powered-off, and is maintained at the 40°–70° C. temperature achieved in stage 702 for 15–30 minutes. At stage 705, the electronic assembly is again powered on, and stages 703 and 704 are alternately repeated 1–3 more times each so as to produce a power on/off cycle with a cumulative 2 hour duration.

During this cycling step 705, the electronic assembly 300 is functionally monitored at least hourly by any known electronic or software-based monitoring scheme via the connector 306, to detect functional anomalies such as electrical discontinuities in the power 304 and sense lines. In a preferred embodiment, the functional monitoring of the electronic assembly 300 would include the application of test instructions to the assembly through any commonly known electronic interface such as a personal computer, coupled to connector 306 of the assembly 300. Certain electronic assemblies 300 have the capability of storing logical faults and creating signals which may be read over the power 304 and sense lines 305, in other assemblies 300, merely monitoring the power 304 and sense lines 305 for signal discontinuities will indicate the presence of a defect. Thus, depending upon the electronic assembly 300 that is being tested, a functional tester will provide test instructions to the electronic assembly 300 and monitor outputs signals for comparison against expected output signals. The output signals on the power 304 and sense lines 305 are, monitored and compared against the expected output signals corresponding to the test instructions. A determination that the signals on the power 304 and sense lines 305 differ from an expected output may occur, for example, when the expected output on a given line, for a particular test instruction, is to be a logic "1" and the monitored output observed thereon is a logical "0". In a preferred embodiment of the invention, the monitoring equipment should be able to detect any such signal incongruence which has a duration that is greater than or equal to 1 millisecond. Any electronic assembly 300 exhibiting a signal anomaly with a duration of 1 millisecond or more is deemed to have failed the electrical burn-in screening test step 420.

Continuing with our analysis of the electrical burn-in test step 420, at stage 706, the powered-on assembly is maintained at the 40°–70° C. temperature for 2 hours while monitoring as previously described. At stage 707, test stages 705 and 706 are repeated so as to provide a total electrical burn-in stress test time of between 11–22 hours with the aforementioned functional monitoring being conducted on at least an hourly basis. Finally, at stage 708 the temperature of the test chamber is lowered at the 5°–20° C. per minute rate to room temperature and the assembly 300 is powered-off, thereby completing the electrical burn-in stress test step 420.

Upon completion of the electrical burn-in stress test step 420, if it is determined via the results of the previously described functional monitoring test, that the assembly has failed, the assembly is either repaired or discarded from the production volume 440 of electronic assemblies 425. In a preferred embodiment of the invention, a simple light emitting diode (LED) circuit is implemented for each of the assemblies under test such that the detection of the aforementioned signal anomalies will light the appropriate LED. At the conclusion of the electrical burn-in stress test step 420, the assemblies having their corresponding LED's turned on are deemed as having failed the electrical burn-in stress test step 420.

Figure 8:
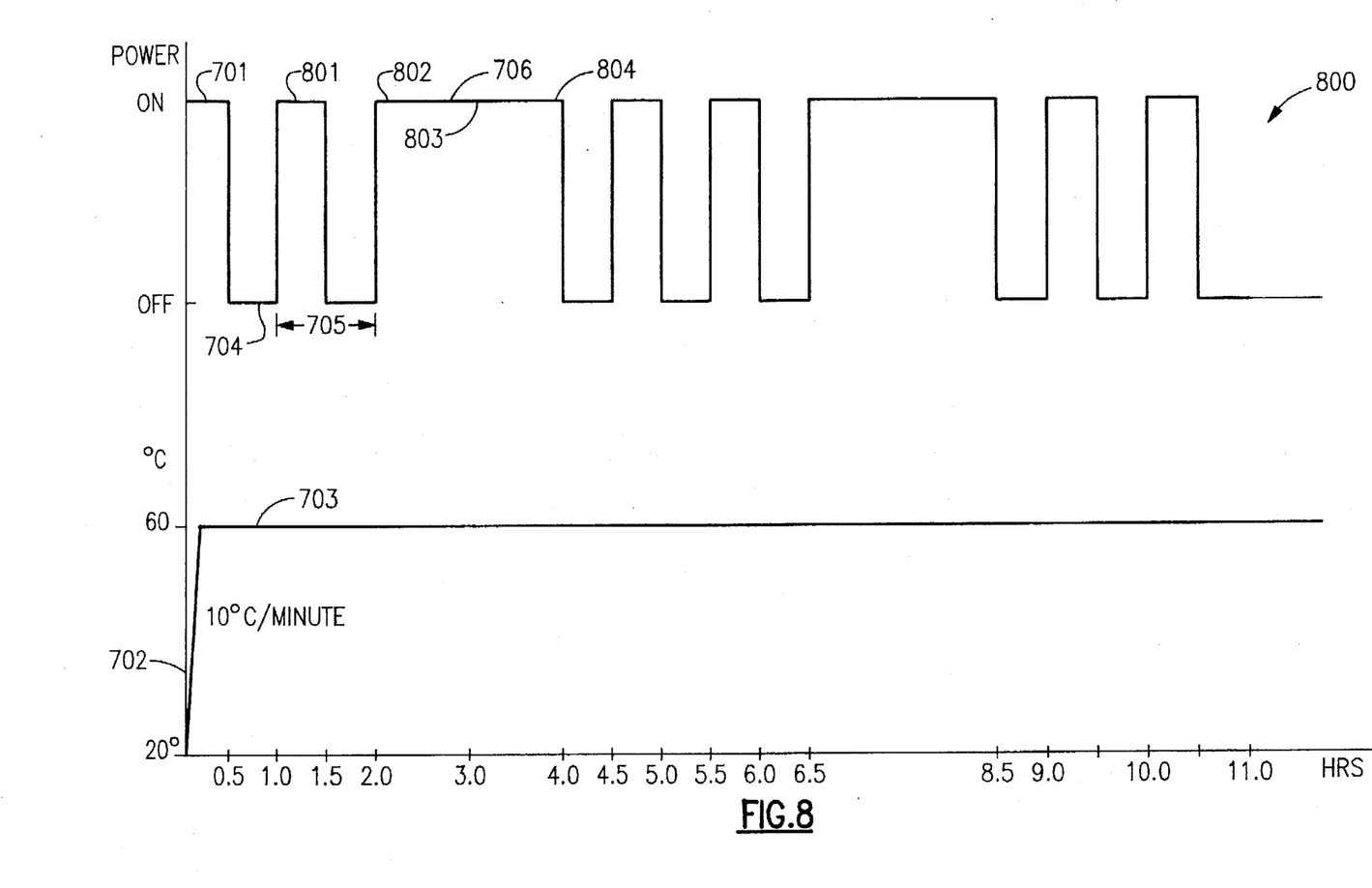
FIG. 8 graphically illustrates a power on/off sequence over time, as performed at elevated temperature, in accordance with the electrical burn-in stress test step 420.

FIG. 8 graphically represents an example of the above-described electrical burn-in stress test step 420. In this graphical depiction 800, the bottom portion of the y-axis represents the temperature, in degrees Celsius, experienced by the electronic assembly 300, the top portion represents the power on/off state of the electrical assembly 300, and the x-axis represents the duration, in minutes, for each of the stages of the electrical burn-in stress test step 420. In accordance with stage 702, the temperature for the powered-on electronic assembly 300 is raised from room temperature (which for illustrative purposes has been chosen as 20° C.) at a rate of between 5°–20° C./minute (illustratively 10° C./minute) to a maximum temperature of 40°–70° C. (illustratively shown as 60° C.). Once the electronic assembly 300 temperature reaches the target temperature from stage 702, the powered-on assembly is maintained at the target temperature for 15–30 minutes (illustratively 30 minutes) as per test stage 703. Thereafter, the electronic assembly 300 is powered off, and maintained at the target temperature for 15–30 minutes (illustratively 30 minutes) as per test stage 704. In accordance with stage 705 these power on/off cycles are again repeated so that the power on/off cycles for the electronic assembly total to 2 hours. Next, the powered-on assembly is maintained at the 40°–70° C. temperature for 2 hours according to stage 706. Additionally, the previously described functional monitoring of the assembly occurs at least every hour. For example, by reference to FIG. 8 the assembly is monitored at the end of the first hour of power on/off cycles 801, at the second hour of power on off cycles 802, at the end of the first hour of the sustained 2 hour period for which the assembly remains powered-on 803 and at the end of the second hour of the sustained 2 hour period for which the assembly remains powered-on 804. Signal anomalies which are detected at any of these monitoring points (i.e. 801–804) result in either the repair or elimination of the defective assembly from production volume 440 at the conclusion of the test step, as previously described 425.

After the electronic assembly 300 has been subjected to the temperature cycling stress test step 410 and the electrical burn-in stress test step 420, and assuming the assembly has not been eliminated for failing these prior two test steps, the assembly 300 is finally subjected to the random vibration stress test step 430. The random vibration stress test step 430 is performed using either electrodynamic or pneumatic vibration test equipment, which must have a frequency response which includes the 10–1000 Hz range of frequencies as well as a vibration power spectral density (PSD) of from 0.005 $g^2$/Hz–0.04 $g^2$/Hz. In our preferred embodiment, a Unholtz Dicke™ model 560 electrodynamic vibration tester was utilized, however any equivalent vibration tester that is currently available may be substituted herein without compromising the integrity of the test process.

Figure 9:
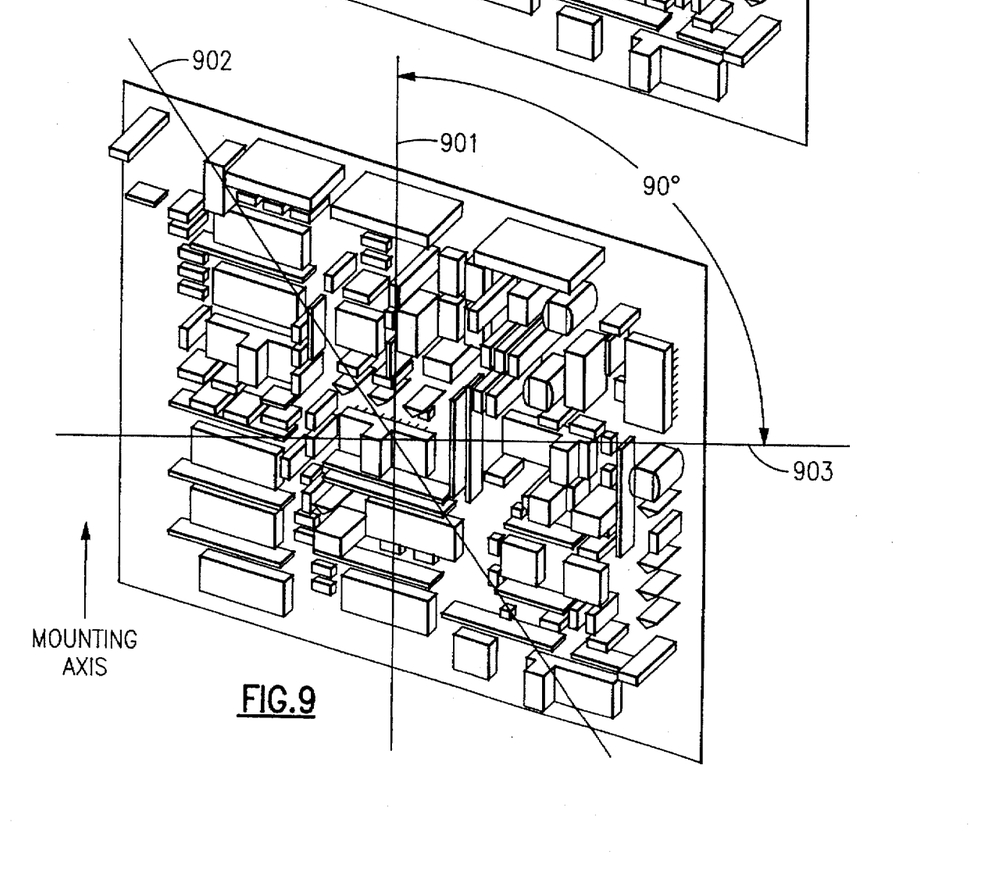
FIG. 9 illustrates the axes about which an exemplary electronic assembly is vibrated in the random vibration stress test depicted at step 430 in FIG. 4.

FIG. 9 illustrates an exemplary electronic assembly 300 positioned for random vibration testing by any of the previously described vibration testers. In accordance with the present inventive test method, the electronic assembly must be vibrated about at least 2 axes during the random vibration stress test step 430. Thus, the illustrated exemplary electronic assembly 300 may be mounted within a vibration test fixture which allows vibration about two or three axes or may be rotated within a particular vibration tester to accomplish the multiple axis vibration. In one embodiment, and without loss of generality, the first axis 901 for the vibration stress test 430, may be the axis about which the electronic assembly is mounted when in use by the customer. The second axis 902 for the exemplary vibration stress test 430 would then be the axis perpendicular to the "mounting axis" used in the first test and perpendicular to the surface of the electronic assembly 300. Furthermore, vibration about the third axis 903 may additionally be performed during the vibration stress test 430. We have found that by performing random vibration test about these at least two axes, the stresses experienced by the electronic assemblies 300 in shipping, installation, and use are adequately reproduced so as to provide an effective screen for marginal assemblies.

Figure 10:
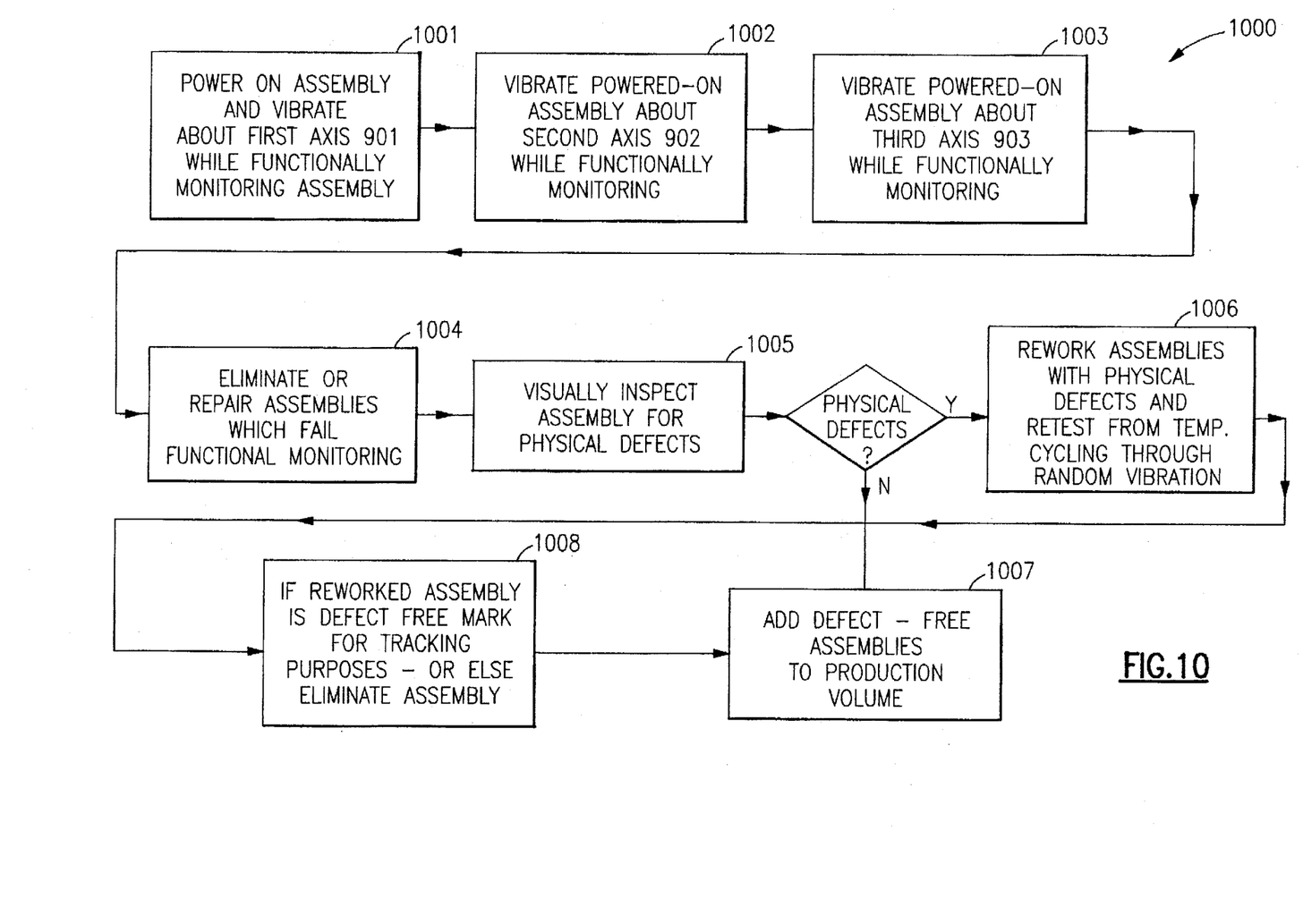
FIG. 10 illustrates a detailed flow diagram for the random vibration stress test step depicted at 430 in FIG. 4.

FIG. 10 depicts a detailed flow diagram for the test stages included in the random vibration stress test step 430. At test stage 1001, the electronic apparatus 300 is powered-on and subjected to random vibrations in the range of 10 Hz–60 Hz, 0.005–0.04 $g^2$/Hz; 70–1000 Hz, 0.005–0.01 $g^2$/Hz about the aforementioned mounting condition axis 901 as measured at the mid-point of the assembly under test. During random vibration step 1001, the electronic assembly is functionally exercised, and appropriate power 304 and sense signals 305 from the assembly 300 are monitored continuously with hardware or software-based electrical signal monitoring equipment, coupled to the connector 306, and capable of detecting a 1 millisecond signal discontinuity in the signals on the power 304 and sense lines 305 as previously described for the electrical burn-in stress test step 420. An electronic assembly 300 that exhibits such signal anomalies is deemed to have failed the random vibration stress test step 430. Detection, and repair or elimination of these failing assemblies 435 occurs at the conclusion of the random vibration stress test step 430, and may be performed in a similar manner as previously described for the electrical burn-in stress test step in step 425. Next, at stage 1002, the assembly is subjected to random vibrations in the range of 10 Hz–60 Hz, 0.005–0.04 $g^2$/Hz; 70–1000 Hz, 0.005–0.01 $g^2$/Hz about the aforementioned axis perpendicular to the mounting condition axis and the surface of the electronic assembly (illustrated as 902) as measured at the mid-point of the assembly under test. The assembly is again continuously functionally exercised and monitored for signal anomalies as in stage 1001. In optional stage 1003, the assembly may be similarly subjected to random vibrations in the range of 10 Hz–60 Hz, 0.005–0.04 $g^2$/Hz; 70– 1000 Hz, 0.005–0.01 $g^2$/Hz about the aforementioned axis perpendicular to the mounting condition axis 901 and the axis perpendicular thereto 902 (illustrated as axis 903 in FIG. 9), again as measured at the mid-point of the assembly under test. Once again, the assembly 300 would be continuously functionally exercised and monitored as in stage 1001 for signal anomalies. At the conclusion of the vibration stress stages (i.e. 1001–1003), the failing electronic assemblies, as determined via the aforementioned functional monitoring, are either repaired or eliminated at 1004 from a production volume 440 of assemblies.

The electronic assembly 300 is thereafter visually inspected at 1005 after step 1004, to reveal any physical defects, such as broken connection points 303 or damage to the electrical components 301 or printed circuit board 302 resulting from the vibrational stresses. As a result of the visual inspection at 1005 it may be determined that an electronic assembly 300 requires repair. Thus, in stage 1006, a defective assembly 300 is reworked after inspection at 1005, and is once again subjected to the sequential stress test steps 410–435 as described herein. In stage 1007, assemblies that do not require rework are considered as part of the production volume 440 of defect-free assemblies. If after rework at 1006 and retesting (410–435), it is determined via inspection 1005 that the assembly is now in acceptable condition, the device should be marked at 1008, for tracking purposes, and added to the production volume 440 of defect-free assemblies at 1007. Alternatively, if after rework at 1005 and retesting at 1001–1003, it is determined via inspection at 1004 that the assembly needs further rework at 1005, it is then discarded at 1008 from the production volume 440 of assemblies at 1006.

Figure 11:
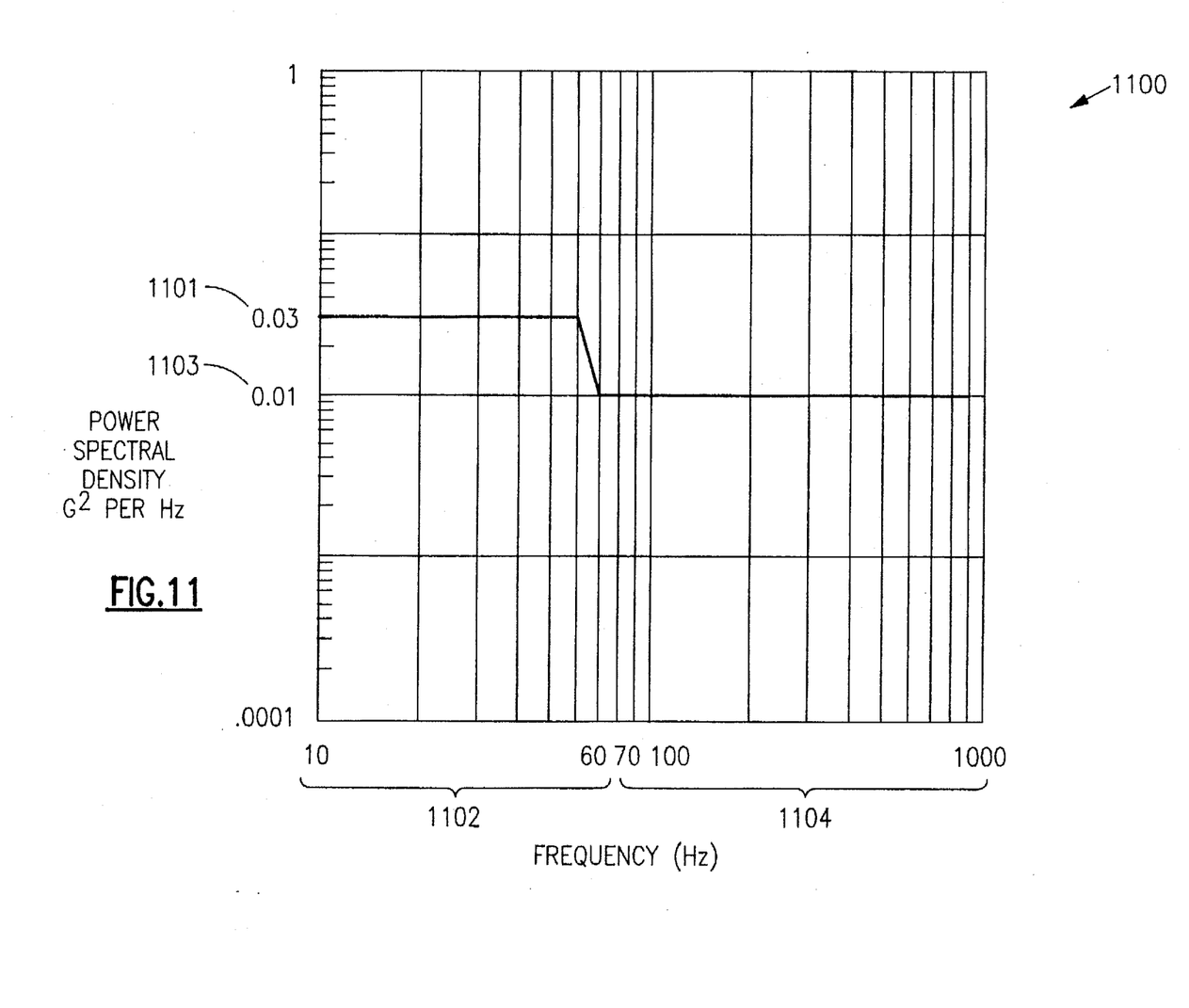
FIG. 11 illustrates the relation between $g^2$/Hz and frequency during the random vibration stress test step 430.

FIG. 11 graphically illustrates the frequency domain representation of random vibration pattern 1100 for the random vibration stress test step 430. The y-axis in FIG. 11 represents the power spectral density (PSD) of the vibration applied to the axes (901, 902 and 903) of the electronic assembly 300, measured in $g^2$/Hz. The x-axis represents the frequency of the vibration applied to the electronic assembly 300, measured in Hz. During the random vibration stress test step 430, the assembly simultaneously 300 experiences all of the graphically illustrated frequencies (i.e. from 10 Hz through 1000 Hz), at the defined PSD (i.e. a PSD in the range of 0.005 $g^2$/Hz–0.04 $g^2$/Hz). In particular, however without loss of generality, the assembly is vibrated at 0.03 $g^2$/Hz 1101 at the frequencies from 10 Hz through 60 Hz 1102 and is vibrated at 0.01 $g^2$/Hz 1103 at the frequencies from 70 Hz through 1000 Hz 1104, defining the illustrated frequency domain representation 1100. It will be understood that since the assembly 300 simultaneously experiences all of the frequencies bounded by the frequency diagram in FIG. 11, that when considered in the time domain, the amplitude and frequency of the vibrations experienced by the electronic assembly 300 being tested appear as substantially random (i.e. pseudo-random) as they are bounded by the previously described amplitude (i.e. PSD) and frequency ranges.

Although the present invention was described as being implemented upon the System/390 Power Supply Assembly, it will be readily apparent to those of ordinary skill in the art that the present invention is equally applicable to any such electronic assembly 300 including electronic components 301 mounted via connection points 303 to a printed circuit board 302. Advantageously, we have found that by incorporating each of these tests into a single screening process, in the order specified and utilizing the previously detailed test parameters, it is possible to detect and screen practically all assemblies which include random and systematic defects while imparting minimal useful life reduction to the remaining production units. Through numerical analysis, based upon results of the present inventive technique, it has been estimated that a field failure rate which is far lower than the failure rates attributable to prior art screening techniques may be achieved.

Though preferred embodiments have been depicted and described in detail herein, it will be apparent to those skilled in the relevant art, both now and in the future, that various modifications, additions, improvements and enhancements may be made without departing from the spirit of the invention, and these are therefore considered to be within the scope of the invention as defined in the following claims which should be construed to maintain the proper protection for the invention first disclosed.

Having described our invention, what we claim as new and desired to secure by Letters Patent is as follows:

1. A method for detecting defects in an electronic assembly including at least one electronic component, coupled via at least one connection point to a printed circuit board, said method comprising the sequentially ordered steps of:

first performing and completing a temperature cycling test upon the electronic assembly and then;

second performing and completing an electrical burn-in test upon the electronic assembly; and then third performing and completing a random vibration test upon the electronic assembly;

wherein each of the sequential test steps are performed and completed separately from the other test steps.

2. A method according to claim 1 wherein the performance of said temperature cycling test step, said electrical burn-in test step, and said random vibration test step cause a minimal reduction in the useful life of said electronic assembly being tested.

3. A method according to claim 1 wherein said defects which are detected include defective ones of said at least one connection points.

4. A method according to claim 1 wherein said defects which are detected include defective ones of said at least one electronic components.

5. A method according to claim 1 wherein said defects which are detected include defects in said printed circuit board.

6. A method according to claim 1 wherein a plurality of electronic assemblies constituting a production volume of said electronic assemblies is tested for detecting defects therein, and any of said plurality of electronic assemblies which are not substantially free from defects are repaired or discarded from said production volume.

7. A method according to claim 1 wherein said temperature cycling test step further includes the steps of:

A. lowering the temperature surrounding the electronic assembly to a predetermined low temperature at a predetermined rate;

B. subjecting said electronic assembly to said predetermined low temperature for a predetermined time period;

C. raising the temperature surrounding the electronic assembly to a predetermined high temperature at said predetermined rate;

D. subjecting said electronic assembly to said predetermined high temperature for said predetermined time period;

E. repeating steps A through D for a predetermined number of times;

F. lowering the temperature surrounding the electronic assembly to room temperature at said predetermined rate; and G. powering on the electronic assembly at room temperature to determine whether it functions properly.

8. A method according to claim 7 wherein the predetermined low temperature is within a range of temperatures from −40° C. through −50° C., the predetermined high temperature is within a range of temperatures from 60° C. through 70° C., and the predetermined rate is within a range of rates from 5° C. per minute through 20° C. per minute.

9. A method according to claim 8 wherein for step A through step B, the temperature surrounding the electronic assembly is first lowered to −50° C. and thereafter raised to −40° C. and maintained at −40° C. for the remainder of said predetermined time period and wherein for step C through step D, the temperature surrounding the electronic assembly is first raised to 70° C. and thereafter lowered to 60° C. and maintained at 60° C. for the remainder of said predetermined time period.

10. A method according to claim 8 wherein the predetermined time period is 30 minutes.

11. A method according to claim 7 wherein said predetermined total number of times is five.

12. A method according to claim 1 wherein said electrical burn-in test step further includes the steps of:

A. powering the electronic assembly on with a predetermined percentage of a maximum electrical load and repairing or discarding said electronic assembly if it is incapable of being powered on;

B. raising the temperature surrounding the powered-on electronic assembly to a predetermined test temperature at a predetermined rate and maintaining the temperature surrounding the electronic assembly at said predetermined test temperature for a period of time;

C. powering off the electronic assembly and maintaining the temperature surrounding the electronic assembly at said predetermined test temperature for said period of time, thereby providing a power on/off cycle for said electronic assembly having a duration equal to two of said periods of time;

D. repeating steps A through C while functionally monitoring said electronic assembly for defects, until said duration of said repeated power on/off cycles is equal to a cumulative power on/off cycle duration;

E. subjecting the powered on electronic assembly to said predetermined test temperature for a duration equal to said cumulative power on/off cycle duration while functionally monitoring said electronic assembly for defects;

F. repeating steps D through E until the duration of said electrical burn-in test step is between 11 through 22 hours;

G. lowering the temperature surrounding the electronic assembly to room temperature at said predetermined rate; and H. discarding or repairing the electronic assembly if defects are detected during the functional monitoring in steps D and E.

13. A method according to claim 12 wherein said predetermined percentage of said maximum electrical load is between 50% to 100% of said maximum electrical load specified for said electronic assembly, said predetermined test temperature is a temperature in a range from 40° C. to 70° C., said predetermined rate is within a range of rates from 5° C. per minute through 20° C. per minute, and wherein said period of time is between 15 minutes through 30 minutes, and said cumulative power on/off cycle duration is 2 hours.

14. A method according to claim 12 wherein said electronic assembly includes at least one power line and at least one sense line, and wherein said functional monitoring of said electronic assembly in steps D and E includes monitoring for electrical signal abnormalities on said at least one power line and on said at least one sense line of the electronic assembly while functionally exercising the electronic assembly to ensure that it functions properly.

15. A method according to claim 14 wherein said electrical signal abnormalities include electrical signals on said at least one monitored power line and said at least one monitored sense line that have logical states that differ from a set of expected logical states for said electrical signals on said at least one monitored power line and said at least one monitored sense line, based upon the functional exercising of the electronic assembly.

16. A method according to claim 14 wherein said signal abnormalities have a duration of at least one millisecond.

17. A method according to claim 12 wherein said functional monitoring in steps D and E is performed at least hourly.

18. A method according to claim 1 wherein said random vibration test step further includes the steps of:

A. vibrating said electronic assembly about a first axis at a predetermined power spectral density within a predetermined range of frequencies for a predetermined duration while functionally monitoring said electronic assembly for defects;

B. vibrating said electronic assembly about a second axis at said predetermined power spectral density within said predetermined range of frequencies for said predetermined duration while functionally monitoring said electronic assembly for defects;

C. inspecting by visual inspection the electronic assembly for physical defects; and D. discarding or repairing the electronic assembly if defects are detected during the functional monitoring in steps A and B or during the inspecting by visual inspection for physical defects in step C.

19. A method according to claim 18 wherein said first axis is perpendicular to said second axis.

20. A method according to claim 19 wherein prior to step C said random vibration test step further includes the step of vibrating said electronic assembly about a third axis perpendicular to said first axis and said second axis at said predetermined power spectral density for said predetermined duration within said predetermined range of frequencies while functionally monitoring said electronic assembly for defects.

21. A method according to claim 18 wherein said predetermined first axis is the axis about which the electronic assembly is to be mounted when in normal operating use and said second axis is perpendicular to said first axis and perpendicular to the of the surface electronic assembly.

22. A method according to claim 18 wherein said predetermined power spectral density is between 0.005 $g^2$/Hz and 0.04 $g^2$/Hz and wherein said predetermined frequency range is from 10 Hz to 1000 Hz and said predetermined duration is 10 minutes.

23. A method according to claim 22 wherein said predetermined power spectral density is 0.03 $g^2$/Hz for frequencies between 10 Hz through 60 Hz within said predetermined frequency range and said power spectral density is 0.01 $g^2$/Hz for frequencies between 70 Hz through 1000 Hz within said predetermined frequency range.

24. A method according to claim 18 wherein said electronic assembly includes at least one power line and at least one sense line and wherein said functional monitoring of said electronic assembly in steps A and B includes monitoring for electrical signal abnormalities on said at least one power line and on said at least one sense line of the electronic assembly while functionally exercising the electronic assembly to ensure that it functions properly.

25. A method according to claim 24 wherein said electrical signal abnormalities include electrical signals on said at least one monitored power line and said at least one monitored sense line that have logical states that differ from a set of expected logical states for said electrical signals on said at least one monitored power line and said at least one monitored sense line, the expected logical states based upon the functional exercising of the electronic assembly.

26. A method according to claim 24 wherein said signal abnormalities have a duration of at least one millisecond.

27. A method according to claim 18 wherein if, in step C, a physical defect is detected, step D further includes the steps of:

D.1. repairing the electronic assembly; and

D.2. repeating, in said ordered sequence said temperature cycling test step, said electrical burn-in test step and said random vibration test step; and wherein if a physical defect is detected after said repeated step C, the electronic assembly is discarded.

28. A method according to claim 27 wherein if a physical defect is not detected in repeated step C the electronic assembly is tracked during its field usage.

* * * * *